United States Patent
Yang et al.

(10) Patent No.: US 10,544,505 B2
(45) Date of Patent: Jan. 28, 2020

(54) DEPOSITION OR TREATMENT OF DIAMOND-LIKE CARBON IN A PLASMA REACTOR

(71) Applicant: Applied Materials, Inc., Santa Clara, CA (US)

(72) Inventors: Yang Yang, Los Gatos, CA (US); Kartik Ramaswamy, San Jose, CA (US); Kenneth S. Collins, San Jose, CA (US); Steven Lane, Porterville, CA (US); Gonzalo Antonio Monroy, San Francisco, CA (US); Lucy Chen, Santa Clara, CA (US); Yue Guo, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/717,822

(22) Filed: Sep. 27, 2017

(65) Prior Publication Data
US 2018/0274089 A1 Sep. 27, 2018

Related U.S. Application Data

(60) Provisional application No. 62/476,186, filed on Mar. 24, 2017.

(51) Int. Cl.
*C23C 16/26* (2006.01)
*C23C 14/30* (2006.01)
(Continued)

(52) U.S. Cl.
CPC ........ *C23C 16/272* (2013.01); *C23C 16/4412* (2013.01); *C23C 16/487* (2013.01); *C23C 16/505* (2013.01); *C23C 16/52* (2013.01); *C23C 16/56* (2013.01); *H01J 37/302* (2013.01); *H01J 37/317* (2013.01); *H01J 37/3233* (2013.01);
(Continued)

(58) Field of Classification Search
CPC ... C23C 16/26; C23C 16/272; C23C 14/0605; C23C 14/30
See application file for complete search history.

(56) References Cited

U.S. PATENT DOCUMENTS 4,645,977 A 2/1987 Kurokawa et al.
4,844,775 A 7/1989 Keeble
(Continued)

OTHER PUBLICATIONS

Ban, Masahito, et al., "Diamond-like carbon films deposited by electron beam excited plasma chemical vapor deposition". Diamond and Related Materials 11 (2002) 1353-1359.*
(Continued)

*Primary Examiner* — Bret P Chen
(74) *Attorney, Agent, or Firm* — Fish & Richardson P.C.

(57) ABSTRACT

A method of performing deposition of diamond-like carbon on a workpiece in a chamber includes supporting the workpiece in the chamber facing an upper electrode suspended from a ceiling of the chamber, introducing a hydrocarbon gas into the chamber, and applying first RF power at a first frequency to the upper electrode that generates a plasma in the chamber and produces a deposition of diamond-like carbon on the workpiece. Applying the RF power generates an electron beam from the upper electrode toward the workpiece to enhance ionization of the hydrocarbon gas.

15 Claims, 3 Drawing Sheets

(51) Int. Cl.
C23C 16/27 (2006.01)
C23C 16/505 (2006.01)
C23C 16/56 (2006.01)
H01J 37/32 (2006.01)
C23C 16/44 (2006.01)
C23C 16/48 (2006.01)
C23C 16/52 (2006.01)
H01J 37/302 (2006.01)
H01J 37/317 (2006.01)
H01L 21/02 (2006.01)

(52) U.S. Cl.
CPC .. *H01J 37/32082* (2013.01); *H01J 37/32449* (2013.01); *H01J 37/32568* (2013.01); *H01J 37/32715* (2013.01); *H01L 21/022* (2013.01); *H01L 21/0234* (2013.01); *H01L 21/02115* (2013.01); *H01L 21/02271* (2013.01); *H01L 21/02351* (2013.01); *H01J 2237/332* (2013.01); *H01J 2237/3321* (2013.01)

(56) References Cited

U.S. PATENT DOCUMENTS

| | | | |
|---|---|---|---|
| 5,171,607 A * | 12/1992 | Cumbo | C23C 14/0605 204/192.35 |
| 5,460,707 A | 10/1995 | Wellerdieck | |
| 5,513,765 A | 5/1996 | Usui | |
| 5,710,486 A | 1/1998 | Ye et al. | |
| 5,711,773 A * | 1/1998 | Selifanov | B24D 3/004 204/192.15 |
| 5,865,896 A | 2/1999 | Nowak et al. | |
| 5,916,820 A | 6/1999 | Okumura et al. | |
| 5,965,217 A * | 10/1999 | Sugiyama | C23C 14/046 427/122 |
| 6,085,688 A | 7/2000 | Lynnberopoulos et al. | |
| 6,422,172 B1 | 7/2002 | Tanaka et al. | |
| 6,582,777 B1 | 6/2003 | Ross et al. | |
| 6,749,813 B1 * | 6/2004 | David | C23C 16/26 422/500 |
| 7,309,514 B2 | 12/2007 | Ross et al. | |
| 7,780,864 B2 | 8/2010 | Paterson et al. | |
| 7,837,826 B2 | 11/2010 | Marakhtanov et al. | |
| 8,547,006 B1 * | 10/2013 | Ives | H01J 25/10 313/383 |
| 8,828,883 B2 | 9/2014 | Rueger | |
| 2002/0187349 A1 * | 12/2002 | Richter | C23C 14/30 428/408 |
| 2003/0035905 A1 * | 2/2003 | Lieberman | C23C 14/0021 427/569 |
| 2003/0077402 A1 | 4/2003 | Amann et al. | |
| 2004/0108470 A1 | 6/2004 | Ichiki | |
| 2004/0134429 A1 | 7/2004 | Yamanaka et al. | |
| 2005/0084680 A1 | 4/2005 | Denes et al. | |
| 2005/0202183 A1 | 9/2005 | Matsuda et al. | |
| 2005/0214535 A1 * | 9/2005 | Denes | A61K 48/00 428/403 |
| 2007/0247073 A1 | 10/2007 | Paterson et al. | |
| 2008/0057192 A1 * | 3/2008 | Faguet | B81C 1/00071 427/237 |
| 2008/0135518 A1 | 6/2008 | Chen et al. | |
| 2008/0268170 A1 | 10/2008 | Pern et al. | |
| 2009/0047760 A1 * | 2/2009 | Yamazaki | H01L 29/04 438/158 |
| 2011/0003087 A1 * | 1/2011 | Soininen | C23C 16/45536 427/569 |
| 2011/0139748 A1 | 6/2011 | Donnelly et al. | |
| 2011/0174606 A1 | 7/2011 | Funk et al. | |
| 2011/0195196 A1 * | 8/2011 | Kim | C23C 14/086 427/453 |
| 2012/0052689 A1 | 3/2012 | Tokashiki | |
| 2012/0088371 A1 | 4/2012 | Ranjan et al. | |
| 2016/0276134 A1 | 9/2016 | Collins et al. | |
| 2018/0274100 A1 | 9/2018 | Yang et al. | |
| 2018/0277340 A1 | 9/2018 | Yang et al. | |

OTHER PUBLICATIONS

Tada, Shigekazu, et al., "Deposition of Diamond-Like Carbon Using Compact Electron-Beam-Excited Plasma Source". Jpn. J. Appl. Phys. vol. 41 (2002) pp. 5408-5414.*

Oleszkiewicz, Waldemar, et al., "Influence of RF ICP PECVD process parameters of diamond-like carbon films on DC bias and optical emission spectra". Optica Applicata, vol. XLIII, No. 1, 2013, pp. 109-115.*

Choi, Won Seok, et al., "The effect of RF power on tribological properties of the diamond-like carbon films". Thin Solid Films 475 (2005) 287-290.*

Pang, Xiaolu, et al., "Fast deposition of diamond-like carbon films by radio frequency hollow cathode method". Thin Solid Films 534 (2013) 226-230.*

Chen et al., Measurement of electron temperatures and electron energy distribution functions in dual frequency capacitively coupled CF4/02 plasmas using trace rare gases optical emission spectroscopy, J. Vac. Sci. Technol, 2009, A27: 1159-1165.

Conlon, "Characterising the deposition of diamond-like carbon on a conducting platinum substrate," PHY3SPM, before 2017, 7 pages.

en.wikipedia.org' [online]. "Electron beam-induced deposition," Feb. 5, 2011 [retrieved on Jan. 19, 2017]. Retrieved from the Internet: URL https://en.wikipedia.org/wiki/Electron_beam-induced_deposition. 5 pages.

International Search Report and Written Opinion in International Application No. PCT/US2018/022453, dated Jul. 4, 2018, 14 pages.

Mori et al., "Fabrication of carbon nanowalls using electron beam excited plasma-enhanced chemical vapor deposition," Diamond and Related Materials, Feb. 2008, 17: 1513-1517.

Moriguchi et al., "History and Applications of Diamond-Like Carbon Manufacturing Processes," SEI Technical Review, Apr. 2016, 52-58.

Tada et al., "Deposition of Diamond-Like Carbon Using Compact Electron-Beam-Excited Plasma Source," Jpn. J. Appl. Phys., 2002, 41: 5408-5414.

* cited by examiner

DEPOSITION OR TREATMENT OF DIAMOND-LIKE CARBON IN A PLASMA REACTOR

CROSS-REFERENCE TO RELATED APPLICATIONS

This application claims priority to U.S. Application Ser. No. 62/476,186, filed on Mar. 24, 2017, the disclosure of which is incorporated by reference.

BACKGROUND

Technical Field

The disclosure concerns deposition or treatment in a plasma reactor of diamond-like carbon on a workpiece such as a semiconductor wafer.

Background Discussion

Diamond-like carbon (DLC) has been used as a coating in various applications such as industrial tools, medical instruments, at the like. Carbon layers with some portion of diamond-like carbon have been used as an etchant mask for some semiconductor fabrication processes. Diamond-like carbon has been deposited by plasma

SUMMARY

In one aspect, a method of performing deposition of diamond-like carbon on a workpiece in a chamber includes supporting the workpiece in the chamber facing an upper electrode suspended from a ceiling of the chamber, introducing a hydrocarbon gas into the chamber, and applying first RF power at a first frequency to the upper electrode that generates a plasma in the chamber and produces a deposition of diamond-like carbon on the workpiece. Applying the RF power generates an electron beam from the upper electrode toward the workpiece to enhance ionization of the hydrocarbon gas.

Implementations may include one or more of the following features.

The first frequency may be between 100 kHz and 27 MHz. The first frequency may be less than 12 MHz, e.g., the first frequency may be about 2 Mhz. Second RF power may be applied at a second frequency to a lower electrode in a pedestal that supports the workpiece while the first RF power is applied to the upper electrode. The first frequency may be equal to or less than the second frequency.

An inert gas may be introduced into the chamber such the plasma is a plasma of both the hydrocarbon gas and the inert gas.

After deposition of a layer of diamond-like carbon on the workpiece, the hydrocarbon gas may be removed from the chamber. After removing the hydrocarbon gas, an inert gas may be introduced into the chamber, and third RF power may be applied at a third frequency to the upper electrode that generates a plasma of the inert gas in the chamber and generates an electron beam from the upper electrode toward the workpiece, the electron beam impinging the layer of diamond-like carbon. Impinging the layer of diamond-like carbon with the electron beam may reduce internal stress in the layer. Fourth RF power may be applied at a fourth frequency to a lower electrode in a pedestal that supports the workpiece while the third RF power is applied to the upper electrode.

In another aspect, a method of treating a layer of diamond-like carbon on a workpiece includes supporting the workpiece in a chamber with the layer of diamond-like carbon facing an upper electrode, introducing an inert gas into the chamber, and applying first RF power at a first frequency to the upper electrode that generates a plasma in the chamber and generates an electron beam from the upper electrode toward the workpiece, the electron beam impinging the layer of diamond-like carbon.

Implementations may include one or more of the following features.

Impinging the layer of diamond-like carbon with the electron beam may reduce internal stress in the layer. Second RF power may be applied at a second frequency to a lower electrode in a pedestal that supports the workpiece. The first frequency may be equal to or less than the second frequency. The inert gas may include argon or helium.

In another aspect, a method of treating a layer of diamond-like carbon on a workpiece, includes supporting the workpiece in a chamber with the layer of diamond-like carbon facing an upper electrode, introducing an inert gas into the chamber, and applying first RF power at a first frequency to the upper electrode such that a plasma of the inert gas is generated in the chamber and the layer of diamond-like carbon is exposed to the plasma of the inert gas.

Implementations may include one or more of the following features.

The inert gas may include argon or helium. Second RF power may be applied at a second frequency to a lower electrode in a pedestal that supports the workpiece.

In another aspect, an electron beam plasma reactor includes a plasma chamber having a side wall, an upper electrode, a first RF source power generator coupled to the upper electrode, a gas supply to provide a hydrocarbon gas, a gas distributor to deliver the hydrocarbon gas to the chamber, a vacuum pump coupled to the chamber to evacuate the chamber, a workpiece support pedestal to hold a workpiece facing the upper electrode, and a controller configured to operate the upper electrode, gas distributor and vacuum pump to generate a plasma in the chamber that produces a deposition of diamond-like carbon on the workpiece and cause the first RF source to apply an RF power that generates an electron beam from the upper electrode toward the workpiece to enhance ionization of the hydrocarbon gas.

In another aspect, an electron beam plasma reactor includes a plasma chamber having a side wall, an upper electrode, a first RF source power generator coupled to the upper electrode, a gas supply to provide an inert gas, a gas distributor to deliver the inert gas to the chamber, a vacuum pump coupled to the chamber to evacuate the chamber, a workpiece support pedestal to hold a workpiece facing the upper electrode, and a controller configured to operate the upper electrode, gas distributor and vacuum pump to generate a plasma in the chamber that anneals a layer of diamond-like carbon on the workpiece and to cause the first RF source to apply an RF power that generates an electron beam from the upper electrode toward the workpiece to impinge the layer of diamond-like carbon.

In another aspect, an electron beam plasma reactor includes a plasma chamber having a side wall, an upper electrode, a first RF source power generator coupled to said upper electrode, a first gas supply to provide a hydrocarbon gas, a second gas supply to provide an inert gas, a gas distributor to deliver the hydrocarbon gas and the inert gas to the chamber, a vacuum pump coupled to the chamber to evacuate the chamber, a workpiece support pedestal to hold a workpiece facing the upper electrode, and a controller configured to operate the upper electrode, gas distributor and vacuum pump to alternate between depositing a layer of diamond-like carbon on the workpiece and treating the workpiece with an electron beam from the upper electrode.

Implementations may include one or more of the following features.

The controller may be configured to cause the gas distributor to deliver the hydrocarbon gas from the first gas supply into the chamber, and cause the first RF power source to apply first RF power at a first frequency to the upper electrode to generate a plasma in the chamber and produce deposition of the layer of diamond-like carbon on the workpiece. A lower electrode and a second RF source power generator may be coupled to the lower electrode and configured to apply second RF power at a second frequency to the upper electrode. The controller may be configured to cause the vacuum pump to remove the hydrocarbon gas from the chamber after deposition of the layer of diamond-like carbon on the workpiece. The controller may be configured to cause the gas distributor to deliver the inert gas from the second gas supply into the chamber after the hydrocarbon gas is removed, and cause the first RF power source to apply third RF power at a third frequency to the upper electrode to generate a plasma of the inert gas in the chamber and generate an electron beam from the upper electrode toward the workpiece, the electron beam impinging the layer of diamond-like carbon to treat the workpiece.

In another aspect, a method of forming a layer of diamond-like carbon on a workpiece includes supporting the workpiece in a chamber with the workpiece facing an upper electrode, and forming a plurality of successive sublayers to form the layer of layer of diamond-like carbon by alternating between depositing a sublayer of diamond-like carbon on the workpiece in the chamber and treating the sublayer with a plasma of the inert gas or an electron beam from the upper electrode.

Implementations may include one or more of the following features.

Depositing a sublayer of diamond-like carbon on the workpiece comprises introducing a hydrocarbon gas into the chamber and applying first RF power at a first frequency to the upper electrode that generates a plasma in the chamber and produces a deposition of the sublayer of diamond-like carbon on the workpiece. Applying the first RF power may generate an electron beam from the upper electrode toward the workpiece to enhance ionization of the hydrocarbon gas.

Treating the sublayer may include introducing an inert gas into the chamber and applying first RF power at a second frequency to the upper electrode that generates a plasma of the inert gas in the chamber. Applying the second RF power may generate an electron beam from the upper electrode that impinges the sublayer of diamond-like carbon on the workpiece.

In another aspect, a method of treating or depositing a layer of diamond-like carbon on a workpiece in a chamber includes supporting the workpiece on a pedestal in the chamber, the workpiece facing an upper electrode suspended from a ceiling of the chamber, introducing an inert gas and/or hydrocarbon gas into the chamber, applying first RF power at a first frequency to the upper electrode that generates a plasma of the inert an inert gas and/or hydrocarbon gas in the chamber to anneal a layer of diamond-like carbon on the substrate or produce a deposition of diamond-like carbon on the workpiece, and applying second RF power at a plurality of discrete frequencies simultaneously to a lower electrode in the pedestal, the plurality of frequencies including second frequency and a third frequency that is higher than the second frequency.

Implementations may include one or more of the following features.

The first frequency may be less than the third frequency. The first frequency may be equal to or less than the second frequency. The second frequency may be less than 2 MHz. The third frequency may be greater than 2 MHz.

In another aspect, an electron beam plasma reactor includes a plasma chamber having a side wall, an upper electrode, a first RF source power generator coupled to said upper electrode, the first RF source power generator configured to apply first RF power at a first frequency to the upper electrode, a first gas supply to provide a hydrocarbon gas, a second gas supply to provide an inert gas, a gas distributor to deliver the hydrocarbon gas and the inert gas to the chamber, a vacuum pump coupled to the chamber to evacuate the chamber, a workpiece support pedestal to hold a workpiece facing the upper electrode, a lower electrode, a second RF source power generator coupled to the lower electrode, the second RF RF source power generator configured to apply second RF power at a plurality of frequencies simultaneously to the lower electrode, the plurality of frequencies including second frequency and a third frequency that is higher than the second frequency, and a controller configured to operate the upper electrode, lower electrode, gas distributor and vacuum pump to deposit or anneal a layer of diamond-like carbon on the workpiece.

Implementations may include one or more of the following features.

The lower electrode may be supported by the workpiece support pedestal.

The first frequency may be less than the third frequency. The first frequency may be equal to or less than the second frequency. The second frequency may be less than 2 MHz. The third frequency may be greater than 2 MHz.

Implementation may include, but are not limited to, one or more of the following advantages. The deposition can be rate can be increased, e.g., to greater than 6 µm/hour at intermediate power levels. The electron beam may enhance ionization of the hydrocarbon gasses and increase the hydrocarbon density. The proportion of high energy electrons can be increased, and the ratio of ions to neutrals can be increased. This can increase the film density, e.g., to about 2 g/cm$^3$. In addition, the electron beam can "cure" the deposited diamond-like carbon film to reduce film stress. For example, the film stress can be less than 500 MPa. The support pedestal for the workpiece does not need to be heated.

The details of one or more implementations are set forth in the accompanying drawings and the description below. Other potential features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

Introduction

In general, it is desirable to increase the density of a film of diamond-like carbon deposited on a workpiece, e.g., a semiconductor wafer being used for fabrication of integrated circuits. For example, an increased film density can provide superior performance as an etch stop layer. Increased film density can also reduce critical dimension variation across the workpiece. Unfortunately, increasing the film density can cause the film stress to increase, which can cause the diamond-like carbon film to peel off the workpiece or cause the workpiece to bow. For example, a diamond-like carbon film having a density greater than 2 g/cm$^3$, at about 1 μm thickness of the film, a stress less than 500 MPa and workpiece bowing less than 200 μm, could provide could provide superior characteristics.

Two techniques can be used to improve fabrication of a film of diamond-like carbon. First, during deposition, a high energy electron beam can be used to enhance ionization of hydrocarbon gas; these hydrocarbon ions are implanted into the growing film to increase the film density. Second, during or after deposition, the film of diamond-like carbon can be exposed to the high energy electron beam; this "cures" (or anneals) the diamond-like carbon film and reduces the film stress. Without being limited to any particular theory, this curing or annealing can change the bonding structure of the carbon film, e.g., decrease dangling bonds and increase cross-linking.

System

Figure 1:
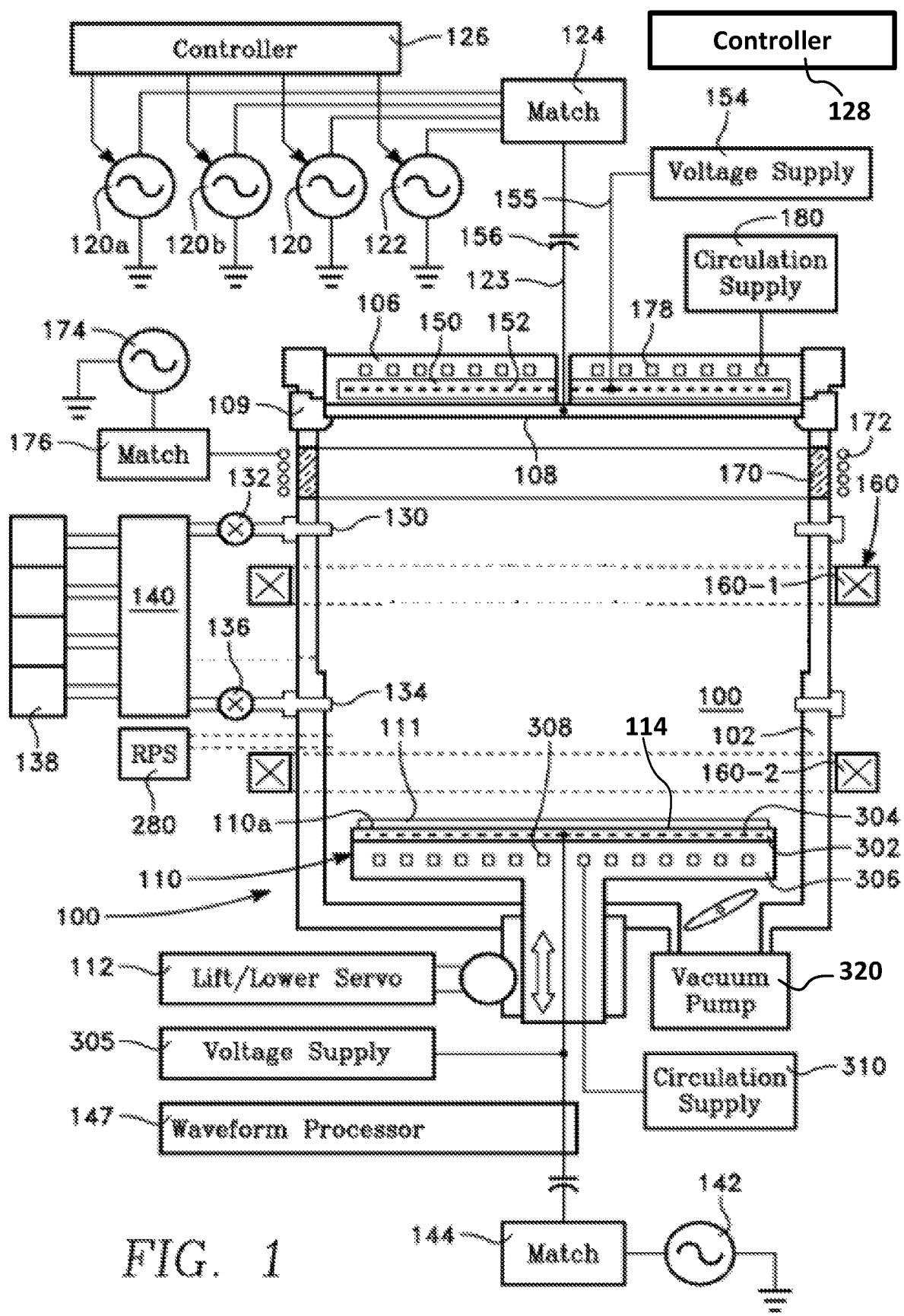
FIG. 1 depicts a plasma reactor.

Referring to FIG. 1, an electron beam plasma reactor has a vacuum chamber body defining a chamber 100 including a side wall 102 of cylindrical shape. A ceiling 106 overlies the chamber 100, and supports an upper electrode 108. The electrode 108 can be formed of a process-compatible material such as silicon, carbon, silicon carbon compound or a silicon-oxide compound, or of a metal oxide such as aluminum oxide, yttrium oxide, or zirconium oxide. The ceiling 106 and the upper electrode 108 may be disk-shaped. In some implementations, an insulator or dielectric ring 109 surrounds the upper electrode 108.

A workpiece support pedestal 110 for supporting a workpiece 111 is positioned in the chamber 100. The pedestal 110 has a workpiece support surface 110a facing the upper electrode 108 and can be movable in the axial direction by a lift servo 112. In some implementations, the workpiece support pedestal 110 includes an insulating puck 302 forming the workpiece support surface 110a, a workpiece electrode 304 inside the insulating puck 302, and a chucking voltage supply 305 connected to the workpiece electrode 304. Additionally, a base layer 306 underlying the insulating puck 302 has internal passages 308 for circulating a thermal medium (e.g., a liquid) from a circulation supply 310. The circulation supply 310 may function as a heat sink or as a heat source.

An RF power generator 120 having a VHF frequency (e.g., 160 MHz) and a lower frequency RF power generator 122 having a frequency below the VHF range or below the HF range (e.g., in the MF or LF range, e.g., 2 MHz) are coupled to the upper electrode 108 through an impedance match 124 via an RF feed conductor 123. The impedance match 124 can be adapted to provide an impedance match at the different frequencies of the RF power generators 120 and 122, as well as filtering to isolate the power generators from one another. The output power levels of the RF generators 120, 122 are independently controlled by a controller 126. As will be described in detail below, power from the RF power generators 120, 122 is coupled to the upper electrode 108.

In some implementations, the ceiling 106 can be electrically conductive and in electrical contact with the upper electrode 108, and the power from the impedance match 124 can be conducted through the ceiling 106 to the upper electrode 108. The side wall 102 can be formed of metal and is grounded. The surface area of grounded internal surfaces inside the upper chamber 100a can be at least twice the surface area of the upper electrode 108. The grounded internal surfaces inside the chamber 100 can be coated with a process compatible material such as silicon, carbon, silicon carbon compound or a silicon-oxide compound, or with a material such as aluminum oxide, yttrium oxide, or zirconium oxide.

In some implementations, the ceiling 106 is a support for the upper electrode 108 and includes an insulating layer 150 containing a chucking electrode 152 facing the upper electrode 108. A D.C. chucking voltage supply 154 is coupled to the chucking electrode 152 via the feed conductor 155, for electrostatically clamping the electrode 108 to the ceiling 106. A D.C. blocking capacitor 156 may be connected in series with the output of the impedance match 124. The controller 126 may control the D.C. chucking voltage supply 154. The RF feed conductor 123 from the impedance match 124 can be connected to the electrode support or ceiling 106 rather than being directly connected to the upper electrode 108. In such an embodiment, RF power from the RF feed conductor 123 can be capacitively coupled from the electrode support to the electrode 108.

In one embodiment, gas injectors 130 provide one or more process gases into the chamber 100 through a valve 132 and/or valve 134. A vacuum pump 320 can be used to evacuate the chamber 100.

Plasma can be produced in the chamber 100 by various bulk and surface processes, including energetic ion bombardment of the interior surface of the electron-emitting upper electrode 108. The ion bombardment energy of the upper electrode 108 and the plasma density are functions of both RF power generators 120 and 122. The ion bombardment energy of the upper electrode 108 can be substantially controlled by the lower frequency power from the RF power generator 122 and the plasma density in the chamber 100 can be substantially controlled (enhanced) by the VHF power from the RF power generator 120. Energetic secondary electrons may be emitted from the interior surface of the upper electrode 108. The flux of energetic electrons from the emitting surface may comprise an electron beam, and may have a direction substantially perpendicular to the interior surface of the upper electrode 108, and a beam energy of approximately the ion bombardment energy of the upper electrode 108, which typically can range from about 10 eV to 5000 eV. The collision cross-sections for different processes depend upon the electron energy. At low energies, cross-sections for excitation (and dissociation in molecular gases) are larger than for ionization, while at high energies the reverse is true. The RF power level(s) may be advantageously selected to target various inelastic electron collision processes.

In some implementations, the plasma density in the chamber 100 can be substantially controlled (enhanced) by the RF power from the an optional RF power generator 174 and coil antenna 172.

At least a portion of the electron beam, comprised of the secondary electron flux emitted from upper electrode 108 due to energetic ion bombardment of the electrode surface, propagates through chamber 100, producing a low electron temperature plasma, with a plasma density that depends upon beam energy and flux, as well as other factors such as pressure and gas composition. The energetic beam electrons can also impinge upon the workpiece 111 or workpiece support pedestal 110. The plasma left behind may readily discharge any resultant surface charge caused by the electron beam flux.

A substantially axially-directed magnetic field, substantially parallel to the electron beam, can be optionally used to help guide the electron beam, improving beam transport through the chamber 100. A low frequency bias voltage or arbitrary waveform of low repetition frequency may be applied a lower electrode 114 that is on or in the workpiece support pedestal 110. The lower electrode 114 can be provided by the workpiece electrode 304, or can be a separate electrode in or on the pedestal 110. The low frequency bias voltage or waveform can selectively or alternately extract positive and/or negative ions from the plasma and accelerate those ions at desired energy levels to impact the surface of the workpiece 111 for etching, cleaning, deposition, or other materials modification.

In some implementations, an RF bias power generator 142 is coupled through an impedance match 144 to the workpiece electrode 304 of the workpiece support pedestal 110.

In some implementations, a magnet 160 surrounds the chamber 100. The magnet can comprise a pair of magnets 160-1, 160-2 adjacent the upper and lower chambers 100a, 100b, respectively. The pair of magnets 160-1, 160-2 can provide an axial magnetic field suitable for confining an electron beam that is propagating from the upper chamber 100a to the lower chamber 100b.

In some implementations, a side window 170 in the side wall 102 to the chamber 100 is formed of a material (e.g., quartz or aluminum oxide) through which RF power may be inductively coupled. An inductive coil antenna 172 surrounds the side window 170 and is driven by an RF power generator 174 through an impedance match 176. The remote plasma source 280 may introduce plasma species into the lower chamber 100b.

In some implementations, internal passages 178 for conducting a thermally conductive liquid or media inside the ceiling 106 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the embodiment of FIG. 1, the force of the mechanical contact is regulated by the electrostatic clamping force provided by the D.C. chucking voltage supply 154.

In an alternative embodiment, an RF-driven coil antenna 290 may be provided over the ceiling 106.

A master controller 128, e.g., general purpose programmable computer, is connected to and operable to control some or all of the various components of the plasma reactor, e.g., the RF power supplies 120, 122, 142, 154, 174, 350, the pumps and valves 132, 136, 140, 320, the actuators 112, and circulation supplies 180, 310.

Figure 2:
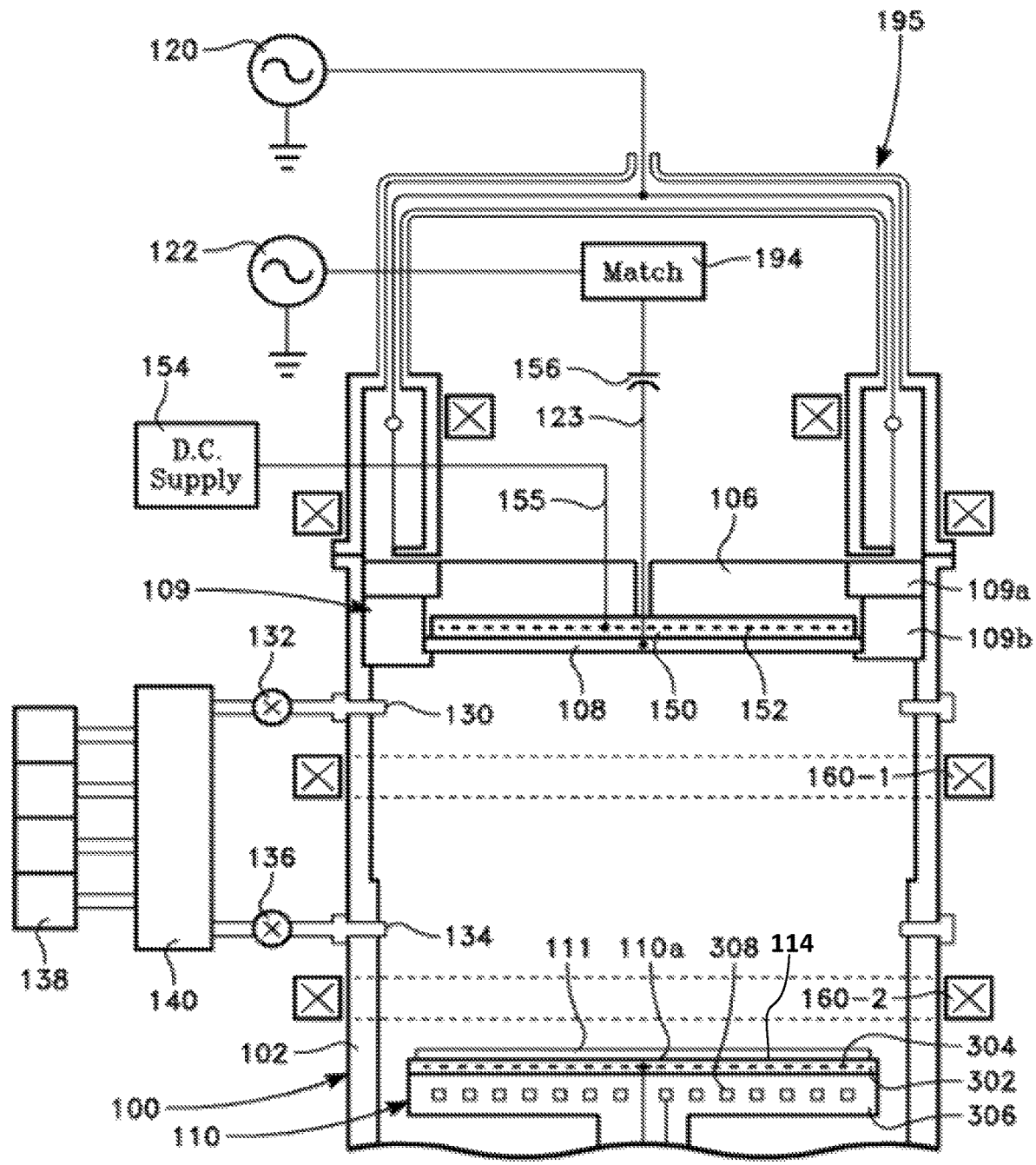
FIG. 2 depicts another implementation of a plasma reactor in accordance with a second embodiment.

FIG. 2 depicts a modification of the embodiment of FIG. 1 in which the RF power (from the RF generator 120) and the lower frequency RF power (from the RF generator 122) are delivered to the electrode 108 through separate paths. In the embodiment of FIG. 2, the RF generator 120 is coupled to the electrode 108 through a folded resonator 195 overlying an edge of the electrode 108. The lower frequency RF generator 122 is coupled to the electrode 108 via the RF feed conductor 123 through an RF impedance match 194. The D.C. chucking voltage supply 154 is coupled to the chucking electrode 152 through the feed conductor 155 extending through a passage in the ceiling 106.

For some processes, a hydrocarbon gas is furnished into the chamber 100, and RF power is applied to the electrode 108, RF power is optionally applied to coil antenna 172 and RPS power is optionally applied to a remote plasma source (RPS) 280. Optionally an inert gas can be furnished into the chamber as well. A plasma is generated in the upper chamber 100 and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. This electron beam flux provides an electron beam which enhances ionization of hydrocarbon gas.

For some processes, an inert gas is furnished into the chamber 100, and RF power is applied to the electrode 108, RF power is optionally applied to coil antenna 172 and RPS power is optionally applied to a remote plasma source (RPS) 280. A plasma is generated in the upper chamber 100 and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. This electron beam flux provides an electron beam which impinges the surface of the workpiece.

Any one the electron beam plasma reactors described above may be employed to carry out the following method of processing a workpiece in an electron beam plasma reactor.

Figure 3:
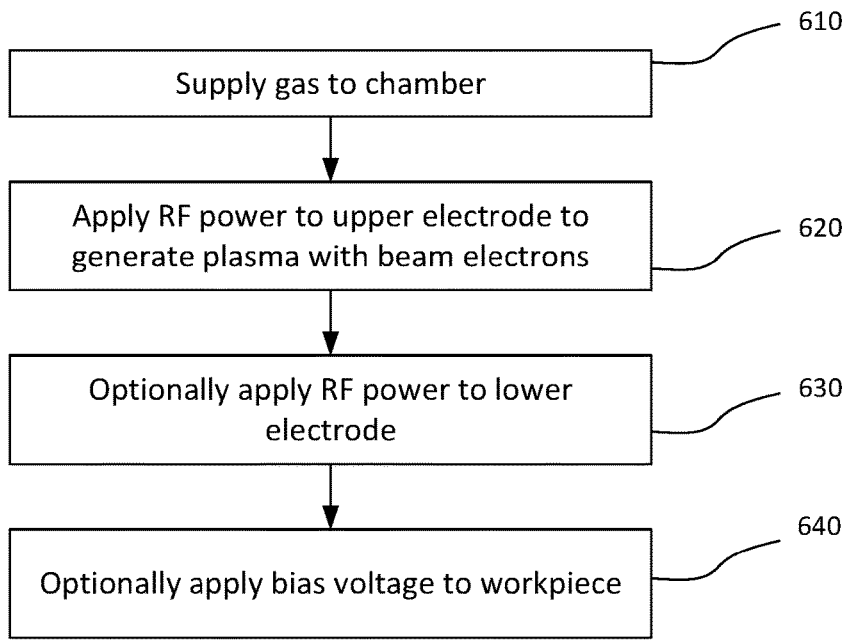
FIG. 3 is a block diagram flow chart depicting a method of depositing a film of diamond-like carbon.
Figure 4:
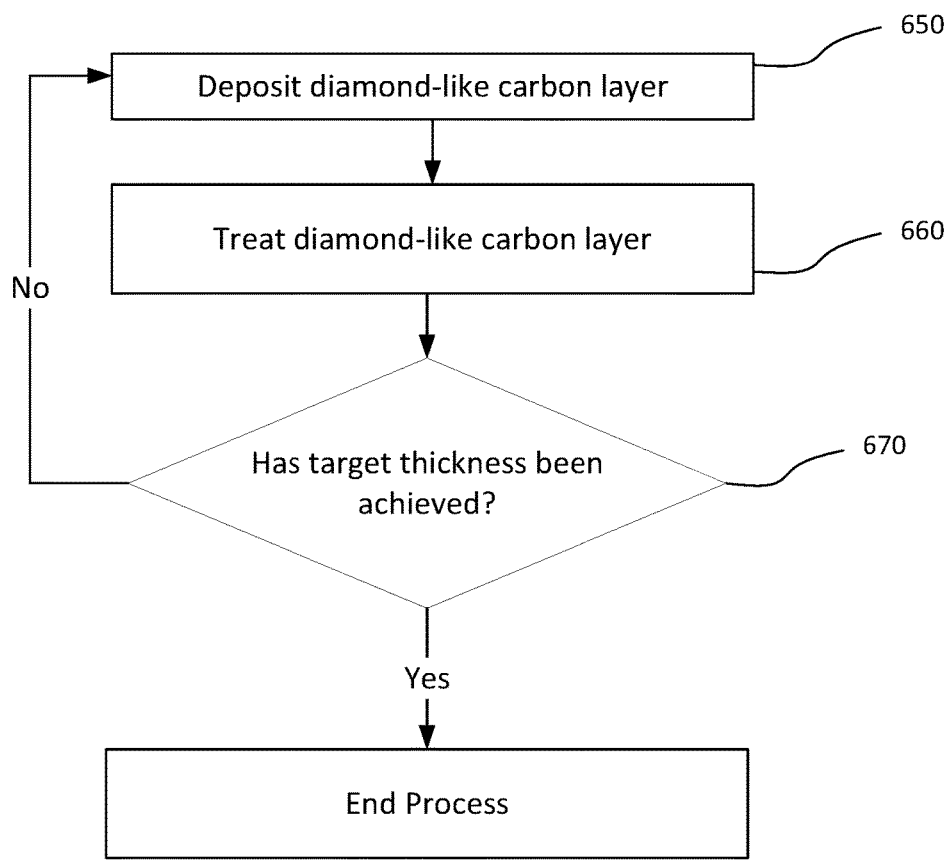
FIG. 4 is a block diagram flow chart depicting a method of treating a film of diamond-like carbon.

Referring now to FIG. 3, a gas is supplied to the chamber 100 (610). As discussed below, the gas can be a hydrocarbon gas and/or an inert gas, depending on the process, e.g., deposition or "curing." RF power is applied to the upper electrode 108 to generate a plasma that includes beam electrons (620). The beam electrons provide an electron beam having a beam propagation direction substantially perpendicular to both the surface of the electrode 108 and the surface of the workpiece 111. The method can optionally include applying RF power to the lower electrode 114 (630). The method can further include applying coupling a bias voltage to the workpiece 111 (640).

Where the gas includes hydrocarbons, the RF power applied to the upper electrode 108 can ionize and dissociate the hydrocarbon gas. RF power applied to the lower electrode can main accelerates hydrocarbon ions to implant into the film being grown, but can also ionize and dissociate the hydrocarbon gas. In addition, the beam electrons can also ionize and dissociate the hydrocarbon gas.

Where the gas is purely inert, the beam electrons can also ionize and dissociate the inert gas, but can pass through and impinge the workpiece.

The controllers, e.g., the controller 126 and/or 128, can be implemented in digital electronic circuitry, or in computer software, firmware, or hardware, or in combinations of them. The controller can include one or more computer program products, i.e., one or more computer programs tangibly embodied in an information carrier, e.g., in a non-transitory machine readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

For example, the controller 128 can be programmed to generate control signals that cause the components of the plasma reactor to carry out the process described below.

Deposition or Treatment of Diamond-Like Carbon

The reactor of FIG. 1 or FIG. 2 may be employed to perform deposition or treatment of a film of diamond-like carbon. In one example, the workpiece 111 includes a semiconductive bulk layer (e.g., monocrystalline Silicon) onto which the film of diamond-like carbon is to be deposited.

In a process for deposition of the diamond-like carbon, a feedstock gas is supplied to the chamber 100 by the gas supply 138. The feedstock gas includes at least a hydrocarbon compound, e.g., $C_2H_2$, $CH_2H_2$, $C_3H_6$, norbornadinene, etc.

An inert gas, e.g., argon or helium, can also be supplied to the chamber 100. The inert gas can be used to dilute the feedstock gas; this can increase plasma density. The inert gas can be mixed with the feedstock gas before being delivered into the chamber 100, or the inert gas could be delivered by separate nozzles 130, 134, and mix in the chamber. In some implementations, the gas supply can establish a total pressure (feedstock and inert gas) of 2 to 100 mTorr.

RF power at a first frequency is applied to the upper electrode 108. The first frequency is a generally "low frequency," e.g., 100 kHz to 27 MHz. The first frequency can be less than 13 MHz, e.g., the first frequency can be 2 MHz.

RF power at a second frequency is also applied to the lower electrode 114. The second frequency is a generally "low frequency," e.g., 100 kHz to 27 MHz. In some implementations, the first and second frequency can be the same frequency. In some implementations, the second frequency is higher than the first frequency. For example, the second frequency can be greater than 2 MHz, e.g., the second frequency can be about 13 MHz.

Application of the RF power to the upper electrode 108 will ignite plasma in the chamber 100. The mere presence of the plasma will generate some hydrocarbon ions (as well as ions of the inert gas), which can be deposited on the workpiece to grow the diamond-like carbon film.

In addition, the electrode 108 is bombarded by the sheath accelerated ions, causing the electrode 108 to emit secondary electrons. The secondary electrons are accelerated by the plasma sheath voltage to an energy on the order of hundreds to thousands of electron volts, thus providing the secondary electron beam from the upper electrode 108 that propagates toward the workpiece 111.

Without being limited to any particular theory, a portion of the secondary electron beam can ionize the hydrocarbon feedstock gas in the chamber 100, thus increasing the hydrocarbon ion density in the plasma. The hydrocarbon ions in the plasma can be accelerated toward the workpiece 111 by the bias power applied to the lower electrode 114. This can cause the hydrocarbon ions to be implanted in the diamond-like carbon film as it is being deposited, thus increasing the film density. In effect, the film can be grown in an ion-implantation manner.

Still without being limited to any particular theory, this processing technique can provide a higher ratio of high energy electrons to low energy electrons in comparison to conventional plasmas in which electrodes are heated by RF fields to disassociate and ionize background gases. Thus, this processing technique can increase the ion-to-neutral ratio in comparison to conventional plasmas.

This deposition process can be carried out with the workpiece at a relatively low temperature, e.g., 10-60° C. Consequently, the pedestal 110 supporting the workpiece 111 does not need to be heated. In some implementations, the pedestal 110 is cooled. A coolant gas, e.g., helium, can flow between the pedestal 110 and the backside of the workpiece 111 to improve heat transfer between the workpiece 111 and the pedestal 110. The workpiece 111 can be electrostatically clamped to the pedestal 110, e.g., by application of a chucking voltage to the electrode 304.

The deposition process can proceed, e.g., for 5-100 seconds. Selection of appropriate power levels and other processing conditions according to the guidelines above can provide deposition rate greater than 6 μm/hour. In addition, the resulting film of diamond-like carbon can have a density greater than 2 g/cm$^3$.

For deposition, the electrode 108 can be formed of carbon. In addition to generating secondary electron beams, the sputtered carbon atoms can also redeposit on the workpiece, thus contributing to the hydrocarbon plasma DLC deposition. As sputtered carbon atoms do not have hydrogen atoms bonded to them, this sputtering deposition component tends to increase film density. Therefore, a carbon electrode can be used to increase film density and modulate film stress.

A process for "curing" of a diamond-like carbon film begins with the film of diamond-like carbon already formed on the substrate. The film of diamond-like carbon could be formed according to the process laid out above, or by a different process. In addition, the diamond-like carbon film could be cured in the same chamber that was used for deposition of the diamond-like carbon film, or in a different chamber. If curing occurs in the same chamber, then the workpiece need not be removed from the chamber between the deposition and curing steps.

In the "curing" process, an inert gas, e.g., argon or helium, is be supplied to the chamber 100 (the feedstock gas is not supplied in this process). The gas supply can establish a pressure of 10 to 200 mTorr.

RF power is supplied to the upper electrode 108 and the lower electrode 114 as described above. In some implementations, the frequencies used for curing can be the same as the frequencies used for deposition. In some implementations, the frequencies used for curing are different than the frequencies used for deposition. The frequencies can be in the range of 100 KHz to 80 MHz.

The workpiece can be subjected to these conditions for, e.g., 2 seconds to 5 minutes.

Without being limited to any particular theory, a portion of the secondary electron beam can pass through the plasma of inert gas and directly impinge the layer on the workpiece 111. These electrons can drive off hydrogen from the layer, and can decrease dangling bonds and increase cross-linking. As a result, stress in the deposited layer can be reduced.

An alternative process for "curing" of a diamond-like carbon film is performed as the process discussed above, e.g., with a plasma of inert gas, but the power and frequencies applied to the upper electrode 108 and lower electrode 110 are such that a secondary electron beam is not generated. Thus, the workpiece is simply exposed to the plasma of inert gas.

In some implementations, a film of diamond-like carbon can be grown by repeatedly alternating between the deposition and "curing" processes. The same chamber can be used for both processes; the workpiece does not need to be removed between processes. For example, after deposition of an initial layer of diamond-like carbon, the chamber the feedstock gas can be evacuated from the chamber 100 and the chamber 100 refilled with the inert gas. This inert gas is then used to perform the "curing" process. After the curing process, the feedstock gas is reintroduced into the chamber 100, and the deposition process is repeated to form another layer of diamond-like carbon over the initial layer. The second layer of diamond-like carbon can then be subjected to the "curing" process. Referring to FIG. 8, the deposition step (650) and "curing" step (660) can be iterated (670), thus depositing and treating consecutive layers onto the workpiece, until a film of a desired thickness has been formed.

In some implementations, multiple frequencies of bias power can be applied simultaneously to the same electrode, e.g., to the lower electrode 114. Use of multiple frequencies of bias power can enhance the film density and reduce the film stress. The lower frequency RF power can boost ion bombarding energy, and applying higher frequencies RF power simultaneously can increase ion flux. Each of the frequencies can be in the range of 100 KHz to 80 MHz. The lower frequency can be at 2 MHz or below, whereas the higher frequency can be above 2 MHz. For example, a combination of 2 MHz and 13 MHz, or 400 KHz and 13 MHz, etc., can be applied to the lower electrode 114. In addition, three or more frequencies could be applied.

While the foregoing is directed to various implementations, other and implementations may be devised that are within the scope of the claims that follow.

What is claimed is:

1. A method of performing deposition of diamond-like carbon on a workpiece, comprising:
    supporting the workpiece in a chamber with the workpiece facing an upper electrode;
    introducing a hydrocarbon gas into the chamber; and
    applying first RF power at a first frequency to the upper electrode that generates a plasma in the chamber and produces a deposition of diamond-like carbon on the workpiece, wherein applying the first RF power to the upper electrode generates an electron beam with electrons emitted from the upper electrode toward the workpiece to enhance ionization of the hydrocarbon gas.

2. The method of claim 1, wherein said first frequency is between 100 kHz and 27 MHz.

3. The method of claim 2, wherein said first frequency is less than 12 MHz.

4. The method of claim 3, wherein the first frequency is about 2 Mhz.

5. The method of claim 1, comprising applying second RF power at a second frequency to a lower electrode in a pedestal that supports the workpiece while the first RF power is applied to the upper electrode.

6. The method of claim 5, wherein the first frequency is less than or equal to the second frequency.

7. The method of claim 1, comprising introducing an inert gas into the chamber such the plasma is a plasma of both the hydrocarbon gas and the inert gas.

8. The method of claim 1, further comprising:
    after deposition of a layer of diamond-like carbon on the workpiece, removing the hydrocarbon gas from the chamber;
    after removing the hydrocarbon gas, introducing an inert gas into the chamber; and
    applying third RF power at a third frequency to the upper electrode that generates a plasma of the inert gas in the chamber and generates an electron beam from the upper electrode toward the workpiece, the electron beam impinging the layer of diamond-like carbon.

9. The method of claim 8, wherein impinging the layer of diamond-like carbon with the electron beam reduces internal stress in the layer.

10. The method of claim 8, comprising applying fourth RF power at a fourth frequency to a lower electrode in a pedestal that supports the workpiece while the third RF power is applied to the upper electrode.

11. A method of treating a layer of diamond-like carbon on a workpiece, comprising:
    supporting the workpiece in a chamber with the layer of diamond-like carbon facing an upper electrode;
    introducing an inert gas into the chamber in which the workpiece is supported without supplying a hydrocarbon gas into the chamber; and
    applying first RF power at a first frequency to the upper electrode that generates a plasma in the chamber and generates an electron beam from the upper electrode toward the workpiece, the electron beam impinging the layer of diamond-like carbon.

12. The method of claim 11, wherein impinging the layer of diamond-like carbon with the electron beam reduces internal stress in the layer.

13. The method of claim 11, comprising applying second RF power at a second frequency to a lower electrode in a pedestal that supports the workpiece.

14. The method of claim 13, wherein the first frequency is less than or equal to the second frequency.

15. The method of claim 11, wherein the inert gas comprises argon or helium.

* * * * *

UNITED STATES PATENT AND TRADEMARK OFFICE
CERTIFICATE OF CORRECTION

PATENT NO. : 10,544,505 B2  
APPLICATION NO. : 15/717822  
DATED : January 28, 2020  
INVENTOR(S) : Yang Yang et al.

Page 1 of 1

It is certified that error appears in the above-identified patent and that said Letters Patent is hereby corrected as shown below:

In the Claims

Column 12, Line 9, in Claim 4, delete "Mhz." and insert -- MHz. -- therefor.

Column 12, Line 16, in Claim 7, after "such" insert -- that --.

Signed and Sealed this
Fourteenth Day of April, 2020

Andrei Iancu
*Director of the United States Patent and Trademark Office*